United States Patent [19]
Ihara et al.

[11] Patent Number: 5,942,358
[45] Date of Patent: Aug. 24, 1999

[54] METHOD OF FORMING A FLUORESCENT SCREEN ON A FRONT PANEL OF A CATHODE RAY TUBE

[75] Inventors: Masaru Ihara, Kanagawa; Katsutoshi Ohno, Tokyo; Hiroshi Uchida; Katsuhiko Kuroda, both of Kanagawa, all of Japan

[73] Assignee: Sony Corporation, Tokyo, Japan

[21] Appl. No.: 08/691,535

[22] Filed: Aug. 2, 1996

[30] Foreign Application Priority Data

Aug. 4, 1995 [JP] Japan .................................. 7-219693
Aug. 4, 1995 [JP] Japan .................................. 7-219694

[51] Int. Cl.$^6$ ..................................................... H01J 31/00
[52] U.S. Cl. ............................ 430/29; 430/25; 430/28; 430/27; 430/253; 430/258; 430/260; 430/293; 430/291
[58] Field of Search ................................. 430/7, 25, 27, 430/28, 29, 252, 253, 258, 259, 291, 260, 293

[56] References Cited

U.S. PATENT DOCUMENTS

| | | | |
|---|---|---|---|
| 3,261,686 | 7/1966 | Celeste et al. | 430/288.1 |
| 3,353,955 | 11/1967 | Colgrove | 430/253 |
| 3,798,034 | 3/1974 | Laridon | 430/253 |
| 4,092,651 | 5/1978 | Rothfuss | 354/1 |
| 4,489,154 | 12/1984 | Taylor, Jr. | 430/253 |
| 4,806,451 | 2/1989 | Frohlich | 430/291 |
| 5,368,991 | 11/1994 | Uchikawa et al. | 430/25 |

FOREIGN PATENT DOCUMENTS

| | | |
|---|---|---|
| 924172 | 4/1973 | Canada ................................... 430/291 |
| 956498 | 10/1974 | Canada ................................... 430/25 |
| 0 105 382 | 4/1983 | European Pat. Off. . |
| 0 145 257 | 11/1984 | European Pat. Off. . |
| 1 600 582 | 4/1977 | Japan . |
| 935627 | 11/1960 | United Kingdom . |
| 2 035 591 | 11/1979 | United Kingdom . |

*Primary Examiner*—Martin Angebranndt
*Attorney, Agent, or Firm*—Hill & Simpson

[57] ABSTRACT

A method of forming a fluorescent screen, such as a black matrix or a color filter, on a front panel of a cathode ray tube is described. The method comprises the steps of forming a photosensitive adhesion layer on an inner surface of the front panel, exposing the photosensitive adhesion layer through a color selecting electrode having a plurality of slots for reducing adhesion level of exposed area of the photosensitive adhesion layer, bringing a pigment layer provided on a supporting sheet into intimate contact with the photosensitive adhesion layer, applying pressure to the pigment layer and the photosensitive adhesion layer, and peeling off the supporting sheet from the pigment layer. Alternatively, a pigment may be dispersed in the photosensitive adhesion pigment layer. In the case, the photosensitive adhesion pigment layer is brought into intimate contact with the inner face of the front panel and exposed through a color selecting electrode, followed by the steps of applying pressure and peeling off a supporting sheet from the photosensitive adhesion pigment layer.

12 Claims, No Drawings

METHOD OF FORMING A FLUORESCENT SCREEN ON A FRONT PANEL OF A CATHODE RAY TUBE

BACKGROUND OF THE INVENTION

This invention relates a method of forming a black matrix or color filter for cathode ray tubes and more particularly, to a method of readily forming a fluorescent screen on a front panel of a cathode ray tube with high accuracy.

For the formation of a black matrix or fluorescent screen on a front panel of a cathode ray tube in related art, a so-called wet photolithographic method has been employed including the steps of slurry coating, exposure to light and wet development. However, this method is disadvantageous in that it includes a number of the steps and an apparatus for carrying out the method is complicated, with poor productivity. Instead, methods using printing techniques such as screen printing have been proposed as a method of forming a black matrix with high productivity (set out, for example, in Japanese Patent Publication No. Sho 55-46674 and Japanese Patent Laid-open No. Hei 6-49398).

Recently, it has been reported that the contrast of a color cathode ray tube is effectively improved by selective suppression of external light reflection by providing pigment layers, i.e. color filters, corresponding to red, blue and green colors in front of red, blue and green-colored fluorescent films. This is described, for example, in Japanese Patent Laid-open No. Hei 5-275008 and Shin-Gaku Technical Report EID 93-102 (1994-01) at page 17. The color filters are formed by a so-called wet photolithographic method including slurry coating, light exposure and wet development, like the known method of forming a fluorescent film on a face plate or front panel of a cathode ray tube.

The above-mentioned screen printing method is high in productivity and is very advantageous from the standpoint of manufacturing facilities, but has the problem, in comparison with the wet photolithographic method, in that the registration accuracy is poorer and especially, it is not suitable for forming a large-sized cathode ray tube.

On the other hand, as stated before, the wet photolithographic method has the drawbacks that it includes a very great number of steps including the step of forming a fluorescent film and that an apparatus becomes complicated and intricate, resulting in poor productivity.

SUMMARY OF THE INVENTION

It is accordingly an object of the invention to provide a method of forming a fluorescent screen, e.g. a black matrix or a color filter pattern, on a front panel of a cathode ray tube according to a dry developing method using a simple apparatus with high accuracy and high productivity.

In order to achieve the above object, we made intensive studies and, as a result, found that black matrix and color filter patterns can be formed readily and with high accuracy according to a dry photolithographic method comprising specific steps defined below.

According to one embodiment of the invention, there is provided a method of forming a fluorescent screen on a front panel of a cathode ray tube which comprises the steps of: forming a photosensitive adhesion layer on an inner surface of the front panel; exposing the photosensitive adhesion layer through a color selecting electrode having a plurality of slots for reducing adhesion level of exposed area of the photosensitive adhesion layer; bringing a pigment layer provided on a supporting sheet into intimate contact with the photosensitive adhesion layer; applying pressure to the pigment layer and the photosensitive adhesion layer; and peeling off the supporting sheet from the pigment layer.

According to another embodiment of the invention, there is also provided a method of forming a fluorescent screen on a front panel of a cathode ray tube which comprises the steps of: forming a photosensitive adhesion pigment layer on a supporting sheet; bringing the photosensitive adhesion pigment layer into intimate contact with an inner face of the front panel; exposing the photosensitive adhesion pigment layer through a color selecting electrode having a plurality of slots for reducing adhesion level of exposed area of the photosensitive adhesion pigment layer; applying pressure to the photosensitive adhesion pigment layer; and peeling off the supporting sheet from the photosensitive adhesion pigment layer.

Preferably, the photosensitive adhesion pigment layer should comprise at least one compound having an ethylenically unsaturated linkage, a photopolymerization initiator comprising a photosensitizer and/or a sensitizing dye and, optionally, an activator therefor, and a pigment.

DETAILED DESCRIPTION OF THE INVENTION

The photosensitive adhesion layer used in the first embodiment of the invention should adhere to an inner face of a front panel of a cathode ray tube and should have photosensitivity sufficient to exhibit low adhesion level or non-adhesion on exposure to light. Usually, the layer includes as its major component a photopolymerizable composition. The photopolymerizable composition should preferably include an addition-polymerizable compound having at least one ethylenically unsaturated linkage (hereinafter referred to simply as ethylenic compound), a photopolymerization initiator consisting of a sensitizer and/or a sensitizing dye capable of absorbing UV or visible light. The photopolymerization initiator may optionally include an activator.

The photosensitive adhesion layer should have adhesion sufficient to transfer a pigment layer provided on a support sheet to the adhesion layer. The ethylenic compound in the photopolymerizable composition is sensitized and cured by exposure to UV or visible light and can thus lower adhesion to such an extent that the pigment layer of the supporting sheet is not transferred at exposed area. The photopolymerizable composition may further consist of organic polymer materials in order to control adhesion level.

The ethylenic compounds and the adhesion level controlling polymer materials are not critical in type and are, respectively, selected from those set out, for example, in Japanese Laid-open Patent Nos. Sho 55-26597 and Sho 55-26596.

The ethylenic compounds include, for example, unsaturated carboxylic acids, esters of aliphatic polyhydroxy compounds and unsaturated carboxylic acids, esters of aromatic polyhydroxy compounds and unsaturated carboxylic acids, and esters of mixtures of unsaturated carboxylic acids and polycarboxylic acids and polyhydroxy compounds such as aliphatic polyhydroxy compounds and aromatic polyhydroxy compounds, and the like.

The ethylenic compounds should preferably have a viscosity of 1000 cps. at below 25° C. If the viscosity is too higher, the adhesion level of the photosensitive adhesion layer lowers, so that the a failure in transfer of the pigment layer to adhesion area may take place. Examples of the preferred ethylenic compound include (meth)acrylate-based ethylenic compounds such as ethylene glycol di(meth)

acrylate, triethylene glycol di(meth) acrylate, trimethylolpropane tri(meth)acrylate, trimethylolethane tri(meth) acrylate and the like.

Examples of the adhesion level controlling polymer material include (meth)acrylic copolymers, alkyl (meth) acrylate copolymers, itaconic copolymers, partially esterified maleic copolymers, cellulose modified products, polyethylene oxide, polyvinylpyrrolidone, polyvinyl alcohol, vinyl chloride copolymers, vinylidene chloride copolymers, styrene copolymers, vinyl acetate copolymers, polyamides including soluble nylons, polyurethanes, polyvinyl butyral, polyesters and mixtures thereof. These polymer materials should preferably have a glass transition point of 80° C. or below.

The photopolymerization initiators are not critical and include initiator compositions consisting of hexaarylbiimidazoles, activators and dyes as set out in Japanese Patent Publication No. Sho 45-37377, compositions consisting of hexaarylbiimidazoles and (p-dialkylaminobenzilidene)ketones as set out in Japanese Patent Laid-open Nos. Sho 47-2528 and Sho 54-155292, compositions consisting of cyclic cis-α-dicarbonyl dyes as set out in Japanese Patent Laid-open No. Sho 48-84183, compositions consisting of substituted triazines and merocyanine dyes as set out in Japanese Patent Laid-open No. Sho 54-151024, and compositions consisting of keto coumarins and activators as set out in Japanese Patent Laid-open Nos. Sho 52-112681, Sho 58-15503 and Sho 60-88005.

Moreover, mentions is made of compositions consisting of substituted triazines and sensitizers as set out in Japanese Patent Laid-open Nos. Sho 58-29803 and Sho 59-40402, compositions consisting of biimidazoles, styrene derivatives and thiols as set out in Japanese Patent Laid-open No. Sho 59-56403, compositions consisting of organic peroxides and dyes as set out in Japanese Patent Laid-open Nos. Sho 59-140203 and Sho 59-189340, and compositions consisting of tetrahydroquinone sensitizers and activators as set out in Japanese Patent Laid-open No. Hei 2-69.

The photopolymerization initiators are appropriately selected from the above compositions in conformity with a wavelength of exposure light from a light source. Preferably, photopolymerization initiator compositions of Japanese Patent Laid-open No. Hei 2-69 consisting of biimidazoles, thiols and tetrahydroquinoline are used. The amount of the activator is usually in the range of from 1 to 100 parts by weight per unit part by weight of a sensitizer or sensitizing dye.

The adhesion level controlling polymer material should preferably be present in amounts of 1 to 500 parts by weight, more preferably 10 to 300 parts by weight, per 100 parts by weight of the ethylenic compound. Likewise, the initiator should preferably be present in amounts of 0.1 to 100 parts by weight, more preferably 0.2 to 50 parts by weight, per 100 parts by weight of the ethylenic compound.

The photosensitive adhesion layer is formed on an inner surface of a front panel of a cathode ray tube in the following manner. A photopolymerizable composition is dissolved in a solvent to obtain a coating solution. The coating solution is coated on the inner surface by spin coating ordinarily used for this purpose. After completion of the coating, the coated layer may be dried under conditions of a temperature of 50 to 200° C. and a time of 1 to 30 minutes.

The solvents for the composition include aromatic solvents such as toluene, xylene and the like, ketone solvents such as methyl ethyl ketone, methyl isobutyl ketone, cyclohexanone and the like, ester solvents such as methyl lactate, ethyl acetate, butyl acetate and the like, alcohol solvents such as isopropyl alcohol, butanol, methyl cellosolve (ethylene glycol monomethyl ether), and the like, halogen solvents such as trichloroethylene, chlorobenzene and the like, and ether solvents such as dioxane, tetrahydrofuran and the like. These solvents may be used singly or in combination. The content of the photopolymerizable composition in the coating solution is preferably in the range of 5 to 50 wt % from the standpoint of coating operations. The dry thickness of the photosensitive adhesion layer is usually in the range of 0.1 to 50 μm, preferably 0.2 to 10 μm. If the adhesion layer is thinner, uniform adhesion is difficult to obtain. On the other hand, when the adhesion layer is greater in the thickness, it is very liable to cause the layer to be peeled off at a final baking step.

The supporting sheet for the pigment layer used in the present invention is not critical so far as the pigment layer can be supported thereon. For instance, the supporting sheet is one made, for example, of polymers such as polyethylene terephthalate, polyethylene, polypropylene, polymethyl methacrylate, polyvinyl chloride, polyvinylidene chloride, polystyrene, nylons, cellulose triacetate and the like. Of these, a polyethylene terephthalate sheet is preferred. The supporting sheet should preferably have a thickness of 1 μm to 10 mm, more preferably 5 μm to 1 mm.

The pigment layer formed on the supporting sheet is made of an opacifying pigment and a binder resin. The ratio by weight between the binder resin and the pigment is in the range of 0.01:1 to 2:1, preferably 0.1:1 to 1:1. The pigment is selected from black pigments such as graphite, carbon black, ruthenium oxide and the like, and metallic pigments such as Ni, Cu, Al, Ag, Au and the like. The pigment should preferably have a particle size of 10 μm or below in order to attain satisfactory opacity. Preferred pigments include conductive fine particles of graphite having a size of several μm to 0.11 μm.

The binder resins are not critical in type and include thermoplastic resins such as vinyl acetate copolymers, polyvinyl butyral resins, ethylene-vinyl acetate copolymers, polyester resins, acrylic resins, polyamide resins, urethane resins and the like.

The opacifying pigment layer is formed by coating, onto a supporting sheet, a coating solution including a pigment and a binder resin. The thickness is generally in the range of 0.2 μm to 20 μm, preferably 0.5 μm to 5 μm. The solvent used to prepare the coating solution may be ones which have been mentioned before with respect to the formation of the photosensitive adhesion layer.

In order to form a fluorescent screen, particularly, a black matrix pattern, on a front panel of a cathode ray tube, a photosensitive adhesion layer is formed on an inner surface of the front panel. A color selecting electrode having a plurality of slots, e.g. a color selecting electrode having an opening pattern corresponding to the black matrix pattern, is located in position. Then, the photosensitive adhesion layer is exposed through the color selecting electrode to light from a UV light exposing device such as a high pressure mercury lamp. The exposure is preferably approximately 5 mJ/cm$^2$ when using a high pressure mercury lamp.

Thereafter, a pigment layer provided on the supporting sheet is superposed on or brought into intimate contact with the thus exposed photosensitive adhesion layer on the front panel, followed by pressing under conditions of a pressure of 1 to 10 kg/cm$^2$, a temperature of 50° C. to 120° C. and a time of 1 to 20 minutes. Subsequently, the supporting sheet is removed or peeled off from the pigment layer. As a result, the pigment layer is left only on non-exposed area, i.e.

adhesion area, of the photosensitive adhesion layer, thereby readily forming a black matrix pattern (i.e. a fluorescent screen) on the photosensitive adhesion layer with high accuracy.

Another embodiment of the invention is described. In this embodiment, the photosensitive adhesion pigment sheet includes a supporting sheet and a photosensitive adhesion pigment layer. The supporting sheet is not critical like the first embodiment and is one made, for example, of polymers such as polyethylene terephthalate, polyethylene, polypropylene, polymethyl methacrylate, polyvinyl chloride, polyvinylidene chloride, polystyrene, nylons, cellulose triacetate and the like. Of these, a polyethylene terephthalate sheet is preferred. The supporting sheet should preferably have a thickness of 1 μm to 10 mm, more preferably 5 μm to 1 mm.

The photosensitive adhesion pigment layer includes, as its major components a photopolymerizable composition and a pigment. The photopolymerizable composition should preferably include an addition-polymerizable compound having at least one ethylenically unsaturated linkage (hereinafter referred to simply as ethylenic compound), a photopolymerization initiator consisting of a sensitizer and/or a sensitizing dye capable of absorbing UV or visible light, like the first embodiment. The photopolymerization initiator may optionally include an activator.

The ethylenic compounds include various types of compounds known as radiation-curable compounds containing acryloyl or methacryloyl group or groups. Examples include (meth) acrylate-based ethylenic compounds such as dipentaerythritol hexa(meth)acrylate, trimethylolpropane tri (meth)acrylate, ethylene glycol di(meth)acrylate, tetrahydrofurfuryl (meth)acrylate, epoxy acrylate, urethane acrylate, polyester acrylates, triethylene glycol di(meth) acrylate, trimethylolethane tri(meth)acrylate and the like. N-vinylpyrrolidone may also be used.

The photosensitive adhesion pigment layer may further include, aside from the photopolymerizable composition and the pigment, adhesion level controlling agents such as polymer materials and plasticizers in order to control adhesion level of the adhesion pigment layer. Examples of the adhesion level controlling polymer material include (meth) acrylic copolymers, alkyl (meth)acrylate copolymers, itaconic copolymers, partially esterified maleic copolymers, cellulose modified products, polyethylene oxide, polyvinylpyrrolidone, polyvinyl alcohol, vinyl chloride copolymers, vinylidene chloride copolymers, styrene copolymers, vinyl acetate copolymers, polyamides including soluble nylons, polyurethanes, polyvinyl butyral, polyesters and mixtures thereof as in the first embodiment. These polymer materials should preferably have a glass transition point of 80° C. or below. The plasticizers used for this purpose include ordinarily used ester plasticizers such as dialkyl phthalates, dialkyl adipates, trialkyl trimellitates and the like.

The pigments used in this embodiment are not critical provided that they are ones ordinarily used as fluorescent film color filters. The pigments include, for example, red pigments such as red oxide, red lead oxide, silver red, cadmium red and the like, blue pigments such as Prussian blue, cobalt blue, cerulean blue, asbolite, ultramarine and the like, and green pigments such as chrome green, zinc green, chromium oxide, viridian, emerald green, cobalt green and the like. The particle size of the pigment should preferably be in the range of 0.01 to 1 μm. The ratio of the pigment in the photosensitive adhesion pigment layer should preferably be in the range of 10 to 70 wt %, more preferably 20 to 50 wt %.

The photosensitive adhesion pigment layer is formed by preparing a coating solution consisting of the above components and an appropriate solvent therefor, coating the solution onto a supporting sheet according to any known coating procedure and drying. The coating methods include, for example, methods using a reverse roll coater, a die coater, a gravure printing machine and the like (as set out in "Coating Systems", written by Yuuji Harasaki and published by Maki Pub., 1979). The solvents used in the coating solution include aromatic solvents such as toluene, xylene and the like, ketone solvents such as methyl ethyl ketone, methyl isobutyl ketone, cyclohexanone and the like, ester solvents such as methyl lactate, ethyl acetate, butyl acetate and the like, alcohol solvents such as isopropyl alcohol, butanol, methyl cellosolve (ethylene glycol monomethyl ether), and the like, halogen solvents such as trichloroethylene, chlorobenzene and the like, and ether solvents such as dioxane, tetrahydrofuran and the like. These solvents may be used singly or in combination. The total concentration of the respective components in the coating solution is preferably in the range of 5 to 50 wt % from the standpoint of coating operations. The thickness of the photosensitive adhesion layer is preferably in the range of 1 to 10 μm.

In order to improve transferability, a release layer may be provided between the supporting sheet and the photosensitive adhesion pigment layer. The release layer may be made of ordinary releasing agents such as waxes, silicone resins and the like.

For the formation of a pattern of pigment layer on an inner face of a front panel of a cathode ray tube using the photosensitive adhesion pigment sheet, the photosensitive adhesion pigment layer of the photosensitive adhesion pigment sheet is brought into intimate contact with the inner surface on which a black matrix has been formed according to any known procedure or in a manner as set out in the first embodiment. The pigment layer and the black matrix are pressed under conditions of a pressure of 1 to 10 kg/cm$^2$, a temperature of 50 to 120° C. and a time of 1 to 20 minutes. A color selecting electrode having a plurality of slots, e.g. a color selecting electrode having a corresponding opening pattern, is located in position. Then, the photosensitive adhesion pigment layer is exposed through the color selecting electrode to light from a UV light exposing device such as a high pressure mercury lamp. The exposure is preferably approximately 5 mJ/cm$^2$ when using a high pressure mercury lamp. Thereafter, the supporting sheet is removed or peeled off from the adhesion pigment layer. As a result, the pigment layer is left only on non-exposed area, i.e. adhesion area, of the photosensitive adhesion pigment layer, thereby readily forming a pigment layer pattern (i.e. a fluorescent screen) on inner surface of the front panel.

The invention is more particularly described by way of examples, which should not be construed as limiting the invention thereof.

EXAMPLE 1

(1) Preparation of a coating solution for photosensitive adhesion layer:

Starting materials indicated in Table 1 below were mixed and dissolved to prepared the coating solution.

TABLE 1

| Coating Solution: | | |
|---|---|---|
| solvent: | methyl ethyl ketone/tetrahydrofuran (4:1 on weight basis) | 50 parts by weight |
| ethylenic compound: | trimethylolpropane acrylate | 7 parts by weight |
| polymer material: | copolymer-1 | 3 parts by weight |
| activator (1): | 2,2'-bis(o-chlorophenyl)-4,4', 5,5'-tetraphenylbiimizazole | 2 parts by weight |
| activator (2): | 2-mercaptobenzthiazole | 0.5 parts by weight |
| sensitizing dye: | compound of the following formula (1) | 0.1 part by weight |

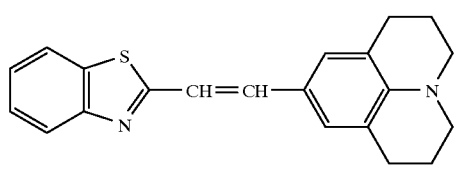

(1)

3 parts by weight of a monomer mixture having a composition indicated in Table 2 below, 0.6 parts by weight of a surfactant ("Newcol 516" commercially available from Nippon Emulsifier Co., Ltd.) and 30 parts by weight of water were agitated in an atmosphere of nitrogen to obtain an emulsion. Subsequently, 0.009 parts by weight of potassium persulfate and 0.009 parts by weight of sodium sulfite were added to the emulsion and heated at 70° C. for 30 minutes, followed by further dropping of 12 parts by weight of a monomer mixture having the same composition as used above and indicated in Table 2 below, 0.081 parts by of potassium persulfate and 0.081 parts by weight of sodium sulfite and thermal polymerization at 70° C. for 1 hour, thereby obtaining an emulsified polymer. The emulsified polymer was coagulated and precipitated by means of methanol, and the precipitate was washed to obtain copolymer-1. The copolymer-1 had a glass transition temperature of 40° C.

TABLE 2

| Monomer mixture: | molar ratio |
|---|---|
| methyl methacrylate | 25 |
| iso-butyl methacrylate (iso-BMA) | 30 |
| methacrylic acid (MAA) | 20 |
| iso-butyl acrylate (iso-BA) | 15 |
| 4-hydroxybutyl acrylate (4HBA) | 5 |

(3) Formation on front panel (face plate)

The coating solution obtained in (1) above was coated, by a spin coater, onto a front panel of a 25-inch wide cathode ray tube in a dry thickness of 2 $\mu$m and dried at 100° C. for 5 minutes to form a photosensitive adhesion layer on the front panel.

(4) Preparation of a coating solution of an opacifying pigment layer:

A mixture having a composition indicated in Table 3 below was dispersed by means of a dispersion mill having glass beads with a diameter of 1 mm and rotating disks at 3000 rpm for 1.5 hours to obtain a coating solution for pigment layer.

TABLE 3

| Coating composition: | | |
|---|---|---|
| polymer material | polyvinyl acetate-vinyl versatate (80:20 on weight basis, weight average molecular weight: 60,000) | 10 g |
| solvent | methyl lactate/methyl ethyl ketone/ tetrahydrofuran (2:2:1 on weight basis) | 100 g |
| opacifying pigment | graphite powder (Hitasol GP-60S, commercially available from Hitachi Funmatsu Yakin K.K.) | 10 g |

(5) Formation of a pigment layer (black matrix) bearing sheet:

The coating solution for pigment layer obtained in (4) above was coated onto a 25 $\mu$m thick biaxially stretched polyethylene terephthalate sheet in a dry thickness of 5 $\mu$m and dried to obtain a sheet for black matrix.

(6) Formation of a black matrix pattern:

A shadow mask was disposed on the front panel (face plate) provided with the photosensitive adhesion layer obtained in (3) and the adhesion layer was exposed to light from a UV light exposing device through a pattern of the shadow mask. The pigment layer of the sheet obtained in (5) was brought into intimate contact with exposed front panel and pressed under conditions of a pressure of 5 kg/cm$^2$, a temperature of 80° C. and a time of 2 minutes. Then, the sheet was peeled off to form a matrix pattern on the front panel. The black matrix pattern was very accurate and uniform.

(7) Formation of color filter:

The general procedures of (4) to (6) were repeated except that graphite in Table 3 was replaced by red oxide as a red pigment, cobalt aluminate as a blue pigment, and a composite oxide of TiO$_2$.ZnO.CoO.NiO as a green pigment, thereby forming a color filter pattern.

EXAMPLE 2

(1) Formation of a photosensitive adhesion pigment sheet:

(1-1) Photosensitive adhesion red pigment sheet:

A coating solution for photosensitive adhesion pigment layer having a composition indicated in Table 4 below was coated onto a 25 $\mu$m thick biaxially stretched polyethylene terephthalate sheet in a dry thickness of 2 $\mu$m and dried at 100° C. to obtain a red photosensitive adhesion sheet.

TABLE 4

| Coating solution for photosensitive adhesion pigment layer: | | |
|---|---|---|
| solvent | methyl ethyl ketone/tetrahydrofuran (4:1 on weight basis) | 50 parts by weight |
| ethylenic compound | trimethylolpropane acrylate | 7 parts by weight |
| polymer material | copolymer-1 | 3 parts by weight |
| activator (1) | 2,2'-bis(o-chlorophenyl)-4,4', 5,5'-tetraphenylbiimizazole | 2 parts by weight |
| activator (2) | 2-mercaptobenzthiazole | 0.5 parts by weight |
| sensitizing dye | compound indicated by formula (1) in Table 1 | 0.1 part by weight |
| red pigment | red oxide | 3 parts by weight |

(1-2) Photosensitive adhesion blue pigment sheet:

The general procedure of (1-1) above was repeated using, in place of the red pigment in Table 4, cobalt aluminate as a blue pigment, thereby obtaining a photosensitive adhesion blue pigment sheet.

(1-3) Photosensitive adhesion green pigment sheet:

The general procedure of (1-1) above was repeated using, in place of the red pigment in Table 4, a composite oxide of $TiO_2 \cdot ZnO \cdot CoO \cdot NiO$ as a green pigment, thereby obtaining a photosensitive adhesion green pigment sheet.

(2) Formation of color filter:

The photosensitive adhesion red pigment layer of the sheet obtained above was brought into intimate contact with a front panel of a 14-inch wide color cathode ray tube on which a black matrix pattern has been formed according to a related art and pressed under conditions of a pressure of 5 kg/cm², a temperature of 80° C. and a time of 2 minutes. Subsequently, the adhesion pigment layer was exposed to UV light through a corresponding shadow mask at normal temperatures. The exposed sheet was peeled off to obtain a red pigment layer pattern.

The photosensitive adhesion blue and green pigment sheets were, successively, brought into intimate contact with the front panel. The exposing device was moved to positions to be formed with blue and green pixels, respectively, and the sheets were exposed to UV light through corresponding shadow masks, followed by peeling off of the respective sheets to obtain the front panel provided with red, blue and green color filters. The pigment layer patterns were each very high in accuracy.

As will be apparent from the foregoing, a black matrix pattern or fluorescent screen with high accuracy and good uniformity can be formed readily. Moreover, after the formation of the fluorescent screen, organic matters such as binder resins can be readily burnt off, thereby ensuring the formation of a cathode ray tube of high quality.

Further, pigment layer pattern or patterns can be readily formed with high accuracy and good productivity by a simple dry developing method which consists of bringing a photosensitive adhesion pigment layer of each of photosensitive adhesion pigment sheets into intimate contact with an inner face of a front panel of a cathode ray tube, exposing the photosensitive adhesion pigment layer through a color selecting electrode having a plurality of slots or openings (i.e. a color selecting electrode having an opening pattern), and peeling off the photosensitive adhesion pigment sheet.

What is claimed is:

1. A dry developing method of forming a fluorescent screen including a black matrix or color filter on a front panel of a cathode ray tube comprising the steps of:

forming a photosensitive adhesion layer on an inner surface of the front panel, the photosensitive adhesion layer comprising a photopolymerizable composition and a photopolymerization initiator, the photopolymerizable composition comprising at least one compound having an ethylene linkage selected from the group consisting of ethylene glycol diacrylate, ethylene glycol methacrylate, triethylene glycol diacrylate, triethylene glycol dimethacrylate, trimethylolpropane triacrylate, trimethylolpropane trimethacrylate, trimethylolethane triacrylate and trimethoylolethane trimethacrylate, the photopolymerizable composition further comprising an adhesion level controlling material selected from the group consisting of alkyl methacrylate copolymers, itaconic copolymers, partially esterified maleic copolymers, cellulose modified products, polyethylene oxide, polyvinylpyrrolidone, polyvinyl alcohol, vinyl chloride copolymers, vinylidene chloride copolymers, styrene copolymers, vinyl acetate copolymers, polyamides, polyurethanes, polyvinyl butyral, polyesters and mixtures thereof, said photosensitive adhesion layer forming step further comprising a coating step for coating a solution of photosensitive adhesion material on the inner surface of the front panel by spin coat method and drying step for drying the solution of photosensitive adhesion material wherein said drying step is drying the solution of photosensitive adhesion material for 1–30 minutes at a temperature of 50–200° C., said photosensitive adhesion layer comprises 100 parts by weight of said at least one compound having an ethylene linkage and 10 to 300 parts by weight of said adhesion level controlling material;

exposing the photosensitive adhesion layer through a color selecting electrode having a plurality of slots for reducing an adhesion level of an exposed area of the photosensitive adhesion layer;

bringing a pigment layer provided on a supporting sheet into intimate contact with the photosensitive adhesion layer;

applying pressure to the pigment layer and the photosensitive adhesion layer; and peeling off the supporting sheet from the pigment layer without any subsequent washing steps.

2. A method of forming a fluorescent screen on a front panel of a cathode ray tube recited in claim 1, wherein said photosensitive adhesion layer has a consistency which is less than or equal to 1000 cps at a temperature of 25° C.

3. A method of forming a fluorescent screen on a front panel of a cathode ray tube recited in claim 1, wherein said adhesion level controlling material has a glass transition point of 80° C. or below.

4. A method of forming a fluorescent screen on a front panel of a cathode ray tube recited in claim 1, wherein said photosensitive adhesion layer has a thickness of 0.1–50 $\mu$m.

5. A method of forming a fluorescent screen on a front panel of a cathode ray tube recited in claim 1, wherein said supporting sheet has a thickness of 5 $\mu$m–1 mm.

6. A method of forming a fluorescent screen on a front panel of a cathode ray tube recited in claim 1, wherein said pigment layer comprises a pigment selected from the group consisting of graphite, ruthenium oxide, carbon black, Ni, Cu, Al, Ag, Au, red oxide, red lead oxide, silver red, cadmium red, Prussian blue, cobalt blue, cerulean blue, asbolite, ultramarine, chrome green, zinc green, chromium oxide, viridian, emerald green and cobalt green.

7. A method of forming a fluorescent screen on a front panel of a cathode ray tube recited in claim 1, wherein said pigment layer has a thickness of 0.5–5 $\mu$m.

8. A method of forming a fluorescent screen on a front panel of a cathode ray tube recited in claim 1, wherein said adhesion level controlling material has a glass transition point of 80° C. or below.

9. A dry developing method of forming a fluorescent screen including a black matrix or color filter on a front panel of a cathode ray tube comprising the steps of:

forming a photosensitive adhesion pigment layer on a supporting sheet, said photosensitive adhesion pigment layer comprising at least one compound having at least one ethylene linkage, an adhesion level controlling material, a photopolymerization initiator comprising a photosensitizer and a pigment, said at least one compound having an ethylene linkage is selected from the group consisting of dipentaerythritol hexa(meth) acrylate, trimethylolpropane tri(meth)acrylate, ethylene glycol di(meth)acrylate, tetrahydrofurfuryl(meth) acrylate, epoxy acrylate, urethane acrylate, polyester acrylates, triethylene glycol di(meth)acrylate and trimethylolethane tri(meth)acrylate, said adhesion level controlling material being selected from the group consisting of alkyl methacrylate copolymers, itaconic copolymers, partially esterified maleic copolymers, cellulose modified products, polyethylene oxide, polyvinylpyrrolidone, polyvinyl alcohol, vinyl chloride copolymers, vinylidene chloride copolymers, styrene copolymers, vinyl acetate copolymers, polyamides, polyurethanes, polyvinyl butyral, polyesters and mixtures thereof, said photosensitive adhesion pigment layer comprises 100 parts by weight of said at least one compound having an ethylene linkage and 10 to 300 parts by weight of said adhesion level controlling material;

bringing the photosensitive adhesion pigment layer into intimate contact with an inner face of a front panel;

exposing the photosensitive adhesion pigment layer through a color selecting electrode having a plurality of slots for reducing an adhesion level of an exposed area of the photosensitive adhesion pigment layer;

applying pressure to the photosensitive adhesion pigment layer; and peeling off the supporting sheet from the photosensitive adhesion pigment layer without any subsequent washing steps.

10. A method of forming a fluorescent screen on a front panel of a cathode ray tube recited in claim 9, wherein said photosensitive adhesion pigment layer has a consistency which is less than or equal to 1000 cps at a temperature of 25° C.

11. A method of forming a fluorescent screen on a front panel of a cathode ray tube recited in claim 9, wherein said supporting sheet has a thickness of 5 μm–1 mm.

12. A method of forming a fluorescent screen on a front panel of a cathode ray tube recited in claim 9, wherein said pigment layer comprises a pigment selected from the group consisting of red oxide, red lead oxide, silver red, cadmium red, Prussian blue, cobalt blue, cerulean blue, asbolite, ultramarine, chrome green, zinc green, chromium oxide, viridian, emerald green and cobalt green.

* * * * *